United States Patent [19]

Bausmith et al.

[11] Patent Number: 4,919,750
[45] Date of Patent: Apr. 24, 1990

[54] ETCHING METAL FILMS WITH COMPLEXING CHLORIDE PLASMA

[75] Inventors: Robert C. Bausmith, Glastonbury, Conn.; William J. Cote, Essex Junction, Vt.; John E. Cronin, Milton, Vt.; Karey L. Holland, Essex, Vt.; Carter W. Kaanta, Colchester, Vt.; Pei-Ing P. Lee; Terrance M. Wright, both of Williston, Vt.

[73] Assignee: International Business Machines Corporation, Armonk, N.Y.

[21] Appl. No.: 342,616

[22] Filed: Apr. 24, 1989

Related U.S. Application Data

[63] Continuation of Ser. No. 96,578, Sep. 14, 1987, abandoned.

[51] Int. Cl.$^5$ .................. C23F 1/00; H01L 23/306
[52] U.S. Cl. .................. 156/643; 156/635; 156/664; 156/666
[58] Field of Search .............. 156/628, 635, 643, 646, 156/664, 665, 666

[56] References Cited

U.S. PATENT DOCUMENTS 4,364,793 12/1982 Graves .............................. 156/643

FOREIGN PATENT DOCUMENTS 55-98827 7/1980 Japan .

OTHER PUBLICATIONS

Coburn, J. W., Plasma-Assisted Etching, Plasma Chemistry and Plasma Processing, vol. 2, No. 1, 1982, pp. 1–40.
Coburn and Winters, Plasma Etching-A Discussion of Mechanisms, Journal of Vacuum Science Technology, vol. 16, No. 2, Mar./Apr., 1979, pp. 391–402.
"Reactive Species Generation for Plasma Etching by Ion Bombardment of a Suitable Compound", B. H. Desilets et al, *IBM TDB*, Jun. 1979, vol. 22, No. 1, pp. 112–113.
"Gaseous Chloride complexes with Halogen Bridges-Homo-Complexes-Hetero-complexes", H. Schafer, *Angewandte Chemie International Edition in English*, Dec. 1976, vol. 15, No. 12, pp. 713–727.
Park et al, "Halide Formation and Etching of Cu Thin Films with Cl$_2$ and Br$_2$", Journal of Vacuum Science & Technology A 4 (1986), Mar./Apr., No. 2, N.Y., N.Y., Second Series, pp. 168–172.
Winters, "Etch Products from the Reaction on Cl$_2$ with a (100) and Cu(100) and XeF$_2$ with W(111) and Nb", Journal of Vacuum Science & Technology/B 3 (1985), Jan.–Feb., No. 1, Second Series, Woodbury, N.Y., USA, pp. 9–15.

Primary Examiner—Kenneth M. Schor
Assistant Examiner—John J. Bruckner
Attorney, Agent, or Firm—M. F. Chadurjian

[57] ABSTRACT

A method for dry etching metals that form low volatility chlordes, in which Z-Cl reaction products are controllably introduced into a conventional Cl-based plasma independent of the workpiece. The Z-Cl products (e.g., AlCl$_3$, GaCl$_3$, etc.) are metal chlorides that have both electron acceptor and chloride donor properties. Thus, metals M (e.g., cobalt, copper and nickel) that usually produce low volatility chlorides can be controllably complexed to form high volatility $Z_xCl_yM_z$ reaction products.

7 Claims, No Drawings

ETCHING METAL FILMS WITH COMPLEXING CHLORIDE PLASMA

This is a continuation of application Ser. No. 096,578 filed Sept. 14, 1987, now abandoned.

TECHNICAL FIELD

The invention relates to etching metals and metal alloys in a Cl-based gaseous plasma.

BACKGROUND ART

For many years, aluminum has been the metallurgy of choice for most integrated circuit applications. Aluminum provides low resistivity characteristics that minimize signal propagation delays and hence enhance chip performance. In order to reduce electromigration defects while enhancing conductivity, small percentages of copper (e.g. up to 10%) have been introduced to form aluminum alloys.

The continuing exponential growth in device density has encouraged process designers to consider metallurgies having enhanced conductivity characteristics. Currently, chemical vapor deposited (CVD) tungsten is being featured in many state-of-the-art designs. However, there is a trend toward finding metallurgies that provide even better conductivity than tungsten. One such metallurgy is pure copper.

In both of the above applications, copper presents difficulties when it is to be etched in an anisotropic mode. Conventionally, metallurgies are anisotropically etched in a reactive ion etch (RIE) mode (i.e., the gaseous plasma is held at a low pressure, and the respective electrodes are held at a high DC bias). Copper reaction products have a low volatility in the presence of the common halogen-based reactive specie that are utilized to etch aluminum metallurgies. In general, this problem has been met by decreasing the chamber pressure and increasing the DC bias, such that the removal mechanism is more of a function of physical bombardment than it is a function of reactive ion complexing. However, with increasing device densities (and the attendant reduced groundrules), the technology has become less tolerant of energetic physical processes.

U.S. Pat. No. 4,468,284 (issued 8/28/84 to Nelson and assigned to Psi Star, Inc.) discloses a process for etching the copper component of an Al/Cu metallurgy. An oxidizing component such as $NO^+$ is added to a conventional Cl-based aluminum RIE. The $NO^+$ causes electron removal from the copper, to produce an intermediate reaction product NOCl. This intermediate product complexes with the $AlCl_3$ products of the Al RIE, to produce a reaction product $CuCl_2$-$Al_2Cl_6$ having a low vapor pressure.

Japanese Unexamined Published Patent Application No. 55-098827 discloses another method of etching the copper component of an Al/Cu alloy. A thin, high-purity aluminum layer is disposed beneath the Al/Cu alloy. Residual copper is removed during the course of etching the underlying thin Al layer.

Because both of the above prior art processes rely on an in situ aluminum source to provide the complexing agent, they will not provide good results when used to etch either an Al/Cu alloy having a high (>4%) Cu component (hereinafter referred to as "Cu-rich Al/Cu alloys"), Cu-based alloys, or a pure Cu film. In the caes of Cu-rich Al/Cu alloy, there will be an excessive amount of Cu present toward the end of the etch cycle relative to the remaining Al. There will not be enough Al available for complexing with the remaining Cu. In the case of the Japanese reference, as the Cu component increases the amount of the underlaying thin Al layer exposed to etching decreases. The above-described drawbacks are particularly true in the case of adaptation to etching a Cu-based alloy or a pure Cu film.

Due to the above-mentioned trends in the technology, a need has developed for a dry etching method that can be used to etch Cu-rich Al/Cu alloys, Cu-based alloys, or pure Cu films, as well as other metal films that normally form low volatility reaction products in Cl-based plasmas.

SUMMARY OF THE INVENTION

It is thus an object of the invention to provide a dry etch method that can be used to etch metals that normally form low volatility reaction products in Cl-based plasmas.

It is another object of the invention to provide a single dry etch method that can be used to pattern Cu-rich Al/Cu alloys, Cu-based alloys, and pure Cu films.

The foregoing and other objects of the invention are realized by a dry etching method in which an independent source of Z-Cl reaction products is introduced into a conventional Cl-based plasma. The particular Z-Cl products generated are both chlorine donors and electron acceptors (e.g., $AlCl_3$, $GaCl_3$, etc.) Thus, metals M (e.g., cobalt, copper, or nickel) that usually produce low volatility chlorides can be controllably complexed to form high volatility $Z_xCl_yM_z$ reaction products without changing the metallurgy.

DESCRIPTION OF THE BEST MODE FOR CARRYING OUT THE INVENTION

The invention is based upon the following experimental observations. The above-discussed prior art copper etch techniques relied upon Al-Cl generation during an Al/Cu etch. Ordinarily, one would expect that adding Al-Cl reaction products to the Al/Cu etch plasma would not alter the etch rate of the Al/Cu layer. However, we found that the Al/Cu reaction rate actually increases with the addition of an external source of Al-Cl reaction products. A possible explanation for this rests in the $CuCl_2$-$AlCl_3$, $CuCl_2$-$Al_2Cl_6$, etc. complexing reactions. Because the complexing reactions occur at the etch front (i.e., the surface being etched), the general Al etch rate may be retarded because surface-generated $AlCl_3$ products are involved in this additional complexing reaction. The higher the Cu percentage, the greater the amount of complexing and the lower the Al/Cu etch rate. Experiments showed that at Cu percentages above approximately 4%, the Al/Cu etch rate is less than one-half the etch rate of pure Al. If Al-Cl products are provided from a source external to the etch front, more surface-generated $AlCl_3$ products may be freed from the complexing reaction and thus can be removed more quickly from the etch front. Thus, the invention is of particular importance in etching Cu-rich Al/Cu alloys.

Experiments were carried out on pure copper films. A one micron thick layer of copper was evaporated onto a silicon substrate having a surface oxide layer. The wafer was exposed for three minutes to a $BCl_3$ (10 SCCM) / $Cl_2$ (20 SCCM)=/ $CHCl_3$ (12 SCCM) / $N_2$ (100 SCCM) RIE at 275 mTorr and 250 Watts. It was found that the copper layer was not appreciably etched. Then a 35 mil thick aluminum wire was suspended within the etch chamber by forming a coil about the cathode, and the above process was repeated. Note that the aluminum wire was not independently biased (that is, it was at the same bias as the plasma). The copper layer was completely removed.

In several other experiments, the above Al wires were used under conditions identical to those outlined above, and Al/3% Cu/2% Si layers were etched. While the usual etch rate of these films is 3000 Å/minute, with the addition of the Al wire the etch rate went up to 4500 Å/minute. However, over the course of time, this etch rate enhancement was no longer observed. It was found that over time, etch residuals coated the unbiased Al wire such that it was no longer producing $AlCl_3$ reaction products. This observation lead to the idea of using a biased Al electrode to prevent excessive buildup and to provide Al-Cl reaction products only when needed.

As a function of the above experimental observations, we concluded that the use of an independently-controlled source of Al to produce Al-Cl reaction products greatly enhances formation of $CuCl_2$-$AlCl_3$ and $CuCl_2$-$Al_2Cl_6$ complexes. This allows copper to be etched in a chemical mode as opposed to a physical mode, without changing the metallurgical structure to be etched. Moreover, because the method of the invention provides Al-Cl reaction products from a source external to the etched surface, the invention provides enhanced Al/Cu alloy etch rates. The invention also provides a single method by which Al/Cu alloys, Cu-based alloys, and pure Cu layers may be chemically etched. This versatility is not presented by any prior art plasma etch methods.

Another advantage presented by no longer relying on the workpiece to generate the Al-Cl reaction products is that different metal-chlorine species Z-Cl providing the same Lewis acid (i.e., electron acceptor) and Cl donor properties of $AlCl_3$ can be used to promote the $Z_xCl_yM_z$ complexing reaction. As shown in Table 13 of an article by H. Schafer, "Gaseous Chloride Complexes With Halogen bridges," *Angewandte Chemie-International Edition In English*, Vol. 15, No. 12, December 1976, pp. 713-727, materials such as $GaCl_3$, $InCl_3$, or $FeCl_3$ can be used to form gaseous complexes with a host of metals that ordinarily form low volatility chlorides. Of these, the invention is most applicable to the metals in the late transition series (i.e., on the Periodic Table of the Elements, the metals in Groups 7b, 8b, 9b, 10b, 1b, and 2b), and more particularly, cobalt, copper and nickel.

In the invention, it is preferred to utilize a powered Al electrode to controllably introduce Al-Cl reaction products independent of the workpiece. The electrode can be in the form of a ring wound about the outside surface of the ceramic chuck that supports the wafer on the cathode of a plasma etch tool. The cathode is biased to a potential of $-V_t$ (say minus 200-300 volts DC). The aluminum electrode is coupled to an independent DC source. When a Cl-based reactive ion etch is carried out, ions will be either attracted to or repelled from the aluminum electrode as function of its potential relative to the cathode as well as to the plasma "dark space" immediately above the wafer in which ions from the plasma are accelerated toward the wafer surface. The voltage of the ions in the dark space is typically slightly above ground potential. If the aluminum electrode is held at a potential slightly above the dark space potential, ions will be repelled from it. If the aluminum electrode is held at a potential that is the same or lower than the plasma potential, ions will be attracted to it. In this latter state, the chlorine-based ions will react with the aluminum to produce an Al-Cl reaction product (e.g., $AlCl_3$, $Al_2Cl_6$, etc.). When the electrode is held at the high potential, the normal etch by-products (i.e., reaction products that are not removed from the chamber) passivate the electrode. When the electrode is switched from high to low potential, the physical component of the RIE causes removal of this passivation layer. The passivation layer provides a further degree of control, in that it protects the electrode from etching when extra Al-Cl reaction products are is not required.

While the invention has been specifically described with reference to a powered Al electrode, other methods of producing $AlCl_3$ independent of the workpiece can be utilized. One method is to provide an Al wire that can be replenished without exposing the reaction chamber to the atmosphere. This could be accomplished by providing a spool of Al wire supported within a housing attached to the reaction chamber. The wire could be unwound from the spool so that is is exposed outside the housing when desired. Another method is to provide a second reaction chamber coupled to the first reaction chamber. An Al layer could be etched in a Cl-based plasma in the second chamber, and the reactive products from the second chamber could be controllably introduced into the first chamber by a sliding closure, etc. By providing the Al-Cl products from a separate chamber, the Al/Cl ratio can be independently controlled.

While the present invention has been described with reference to a particular Cl-based etch chemistry, any Cl-based etch chemistry will work. The reactions that form the basis of the invention are all Cl-dominated, and as such will be reproducible for different Cl-based chemistries.

It is to be understood that while various modifications may be made to the structures and teachings of the best mode as desribed above, such modifications fall within the ambit of the present invention.

We claim:

1. A method of etching a surface of a layer made up of a metal M or an alloy having the metal M as its majority component by weight percent. the metal M being selected from the group consisting of cobalt, copper, or nickel, said layer being disposed on a workpiece positioned within a RIE reaction chamber, comprising the steps of inserting the workpiece into the RIE reaction chamber and exposing the layer to a reactive ion etch in a chlorine-based plasma in the presence of a source of a metal Z spaced apart from the workpiece to provide Z-Cl gaseous reaction products which serve as the principal complexing agent with said cobalt, copper, or nickel to form volatile M-based M-Z-Cl reaction products and continuing said exposure until said layer is etched by the removal of M-Z-Cl based reaction products formed during the reactive ion etching.

2. The method as recited in claim 1, wherein said metal Z is selected from the group consisting of Al, Ga, Fe, and In.

3. The method is recited in claim 1, wherein said Z-Cl gaseous products are produced by exposing a wire comprised of said metal Z or comprised of an alloy of said metal Z to said Cl-based ions in said first reaction chamber.

4. The method as recited in claim 3, wherein said wire is independently biased with respect to said workpiece.

5. The method as recited in claim 1, wherein said Z-Cl gaseous products are produced by etching a metal source substrate comprised of said metal Z or an alloy of said metal Z in a Cl-based plasma generated in second reaction chamber, and feeding said Z-Cl reaction products from said second reaction chamber to said first reaction chamber.

6. In a method of etching the surface of a film selected from either a Cu film or an alloy film having Cu as its majority component by weight percent in a Cl based plasma by exposure of said film to an RIE carried out in an RIE reaction chamber. the improvement comprsing the addition of an aluminum electrode to the reactive chamber said electrode being spaced apart from said film and being independently biased with respect to said film. to selectively provide additional Al-Cl reaction products that serve as the principal complexing agent which during RI-etching form volatile complexes with Cu, and continuing said exposure until said film is etched by the removal of Cu-Al-Cl based reaction products formed during the reactive ion etching.

7. The method as recited in claim 6, wherein said films or alloys are on a workpiece disposed on a ceramic support within the reaction chamber, and wherein said aluminum electrode comprises a wire wound about said ceramic support.

* * * * *